(12) United States Patent
Akutsu

(10) Patent No.: US 11,049,842 B2
(45) Date of Patent: Jun. 29, 2021

(54) ALIGNMENT METHOD, METHOD FOR CONNECTING ELECTRONIC COMPONENT, METHOD FOR MANUFACTURING CONNECTION BODY, CONNECTION BODY AND ANISOTROPIC CONDUCTIVE FILM

(71) Applicant: DEXERIALS CORPORATION, Tokyo (JP)

(72) Inventor: Yasushi Akutsu, Utsunomiya (JP)

(73) Assignee: DEXERIALS CORPORATION, Tokyo (JP)

(\*) Notice: Subject to any disclaimer, the term of this patent is extended or adjusted under 35 U.S.C. 154(b) by 0 days.

(21) Appl. No.: 16/247,957

(22) Filed: Jan. 15, 2019

(65) Prior Publication Data
US 2019/0206831 A1    Jul. 4, 2019

Related U.S. Application Data

(62) Division of application No. 15/117,326, filed as application No. PCT/JP2015/052924 on Feb. 3, 2015, now abandoned.

(30) Foreign Application Priority Data

Feb. 7, 2014  (JP) ................. 2014-022861

(51) Int. Cl.
*H01L 23/00* (2006.01)
*C09J 9/02* (2006.01)
(Continued)

(52) U.S. Cl.
CPC ............ *H01L 24/83* (2013.01); *C09D 163/00* (2013.01); *C09J 7/10* (2018.01); *C09J 9/02* (2013.01);
(Continued)

(58) Field of Classification Search
None
See application file for complete search history.

(56) References Cited

U.S. PATENT DOCUMENTS

2008/0006952 A1\* 1/2008 Lee .................. H01L 24/29
257/797
2009/0206411 A1\* 8/2009 Koketsu ............. H01L 24/81
257/368

FOREIGN PATENT DOCUMENTS

JP    2005-026577 A    1/2005
JP    2008-101962 A    5/2008
(Continued)

OTHER PUBLICATIONS

Apr. 14, 2015 International Search Report issued in International Patent Application No. PCT/JP2015/052924.
(Continued)

*Primary Examiner* — Steven M Christopher
(74) *Attorney, Agent, or Firm* — Oliff PLC

(57) ABSTRACT

An alignment mark at a position that overlaps an area in which an anisotropic conductive film is pasted, and to accurately perform alignment using an image captured by a camera. An alignment method in which an electronic component is mounted on the obverse surface of a transparent substrate with a conductive adhesive agent interposed therebetween, a substrate-side alignment mark and a component-side alignment mark are adjusted from the captured image, and the position at which the electronic component is mounted on the transparent substrate is aligned, wherein in the conductive adhesive agent, conductive particles are in a regular arrangement as viewed from a planar perspective, and in the captured image, the outside edges of the alignment marks exposed between the conductive particles are intermittently visible as line segments (S) along the imagi-
(Continued)

nary line segments of the outside edges of the alignment mark.

21 Claims, 6 Drawing Sheets

(51) Int. Cl.
*H05K 1/02* (2006.01)
*H05K 3/32* (2006.01)
*H01L 23/544* (2006.01)
*C09D 163/00* (2006.01)
*G02F 1/1345* (2006.01)
*C09J 7/10* (2018.01)
*G02F 1/1333* (2006.01)
*C09J 171/12* (2006.01)
*G02F 1/133* (2006.01)
*G02F 1/1339* (2006.01)
*G02F 1/1343* (2006.01)

(52) U.S. Cl.
CPC ........ *G02F 1/13452* (2013.01); *H01L 23/544* (2013.01); *H01L 24/29* (2013.01); *H01L 24/81* (2013.01); *H05K 1/0269* (2013.01); *H05K 3/323* (2013.01); *C08K 2201/001* (2013.01); *C09J 171/12* (2013.01); *C09J 2203/326* (2013.01); *C09J 2301/408* (2020.08); *G02F 1/1339* (2013.01); *G02F 1/1345* (2013.01); *G02F 1/13306* (2013.01); *G02F 1/13439* (2013.01); *G02F 1/133302* (2021.01); *G02F 1/133354* (2021.01); *G02F 1/134309* (2013.01); *G02F 2202/28* (2013.01); *H01L 24/13* (2013.01); *H01L 24/16* (2013.01); *H01L 24/27* (2013.01); *H01L 24/32* (2013.01); *H01L 24/75* (2013.01); *H01L 24/91* (2013.01); *H01L 24/92* (2013.01); *H01L 2223/5442* (2013.01); *H01L 2223/54426* (2013.01); *H01L 2223/54473* (2013.01); *H01L 2223/54486* (2013.01); *H01L 2224/13144* (2013.01); *H01L 2224/16225* (2013.01); *H01L 2224/16227* (2013.01); *H01L 2224/27003* (2013.01); *H01L 2224/27334* (2013.01); *H01L 2224/294* (2013.01); *H01L 2224/2919* (2013.01); *H01L 2224/2929* (2013.01); *H01L 2224/2936* (2013.01); *H01L 2224/2939* (2013.01); *H01L 2224/29082* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29371* (2013.01); *H01L 2224/29387* (2013.01); *H01L 2224/29388* (2013.01); *H01L 2224/29393* (2013.01); *H01L 2224/32225* (2013.01); *H01L 2224/73204* (2013.01); *H01L 2224/75753* (2013.01); *H01L 2224/8113* (2013.01); *H01L 2224/81132* (2013.01); *H01L 2224/81191* (2013.01); *H01L 2224/81203* (2013.01); *H01L 2224/81903* (2013.01); *H01L 2224/8313* (2013.01); *H01L 2224/83101* (2013.01); *H01L 2224/83132* (2013.01); *H01L 2224/83192* (2013.01); *H01L 2224/83203* (2013.01); *H01L 2224/83851* (2013.01); *H01L 2224/83862* (2013.01); *H01L 2224/83874* (2013.01); *H01L 2224/83885* (2013.01); *H01L 2224/9211* (2013.01); *H05K 2203/166* (2013.01)

(56) References Cited

FOREIGN PATENT DOCUMENTS

JP 2008101962 A * 5/2008
WO 2013/089199 A1 6/2013
WO WO-2013089199 A1 * 6/2013 ............. H01L 24/29

OTHER PUBLICATIONS

Aug. 11, 2016 International Preliminary Report on Patentability issued in International Patent Application No. PCT/JP2015/052924.
Mar. 16, 2018 Office Action issued in U.S. Appl. No. 15/117,326.
Niematsu et al.,"Semiconductor Chip E.G. Semiconductor Wafer With Anisotropically Conductive Film for Manufacturing U Semiconductor Device, Has Semiconductor Chip Having Several Circuit Electrodes on Surface, and Anisotropically Conductive Film"; Jun. 20, 2013, Derwent Translation; Derwent Acct. No. 2013-L24557.
Office Action in Korean Application No. 10-2016-7019759 dated May 13, 2021.

* cited by examiner

ALIGNMENT METHOD, METHOD FOR CONNECTING ELECTRONIC COMPONENT, METHOD FOR MANUFACTURING CONNECTION BODY, CONNECTION BODY AND ANISOTROPIC CONDUCTIVE FILM

This application is a divisional application of U.S. patent application Ser. No. 15/117,326, filed Aug. 8, 2016, which is a National Stage Application of PCT/JP2015/052924, Feb. 3, 2015 which claims priority to Japanese Patent Application No. 2014-022861 filed on Feb. 7, 2014, the entire contents of which are hereby incorporated by reference.

TECHNICAL FIELD

The present disclosure relates to an alignment method of an electronic component and a circuit substrate, and more particularly relates to an alignment method of an electronic component and a circuit substrate, a method for connecting an electronic component, a method for manufacturing a connection body, a connection body and an anisotropic conductive film for connecting the electronic component to the circuit substrate via an adhesive agent containing conductive particles.

BACKGROUND ART

Conventionally, devices such as televisions, PC monitors, mobile phones, smart phones, portable game devices, tablet devices, wearable devices and automotive monitors, among others, have used a liquid crystal display device or an organic EL panel as a display means. In recent years, in such display devices, in view of finer pitches and thinner and lighter devices, mounting of driver ICs directly onto glass substrates of display panels, which is known as COG (chip on glass), has been employed.

For example, in a liquid crystal display panel in which COG mounting is employed, as shown in FIG. 8A and FIG. 8B, a plurality of transparent electrodes 102 made from, among other materials, ITO (indium tin oxide), are formed onto a transparent substrate 101 made of a glass substrate, and an electronic component such as a liquid crystal driver IC 103 is connected onto these transparent electrodes 102. The liquid crystal driver IC 103 has connecting terminals 104 corresponding to the transparent electrodes 102 formed onto the mounting surface thereof and is thermocompression-bonded onto the transparent substrate 101 via an anisotropic conductive film 105, thereby connecting the connecting terminals 104 to the transparent electrodes 102.

The anisotropic conductive film 105 contains a binder resin into which conductive particles are dispersed, and is film-formed, and by being thermocompression-bonded between two conductors, electrical conduction between the conductors is achieved by the conductive particles and mechanical connection between the conductors is ensured between the conductors by the binder resin. The adhesive agent constituting the anisotropic conductive film 105, although typically a highly reliable thermosetting binder resin is used, may be a photosetting binder resin or a thermo/photosetting binder resin.

In the case of connecting the liquid crystal driver IC 103 to the transparent electrodes 102 via such an anisotropic conductive film 105, the anisotropic conductive film 105 is first temporarily bonded onto the transparent electrodes 102 of the transparent substrate 101 by a temporary pressure bonding means which is not illustrated in the drawings. After mounting the liquid crystal driver IC 103 onto the transparent substrate 101 via the anisotropic conductive film 105 to form a temporary connection body, a thermocompression bonding means, for example, a thermocompression bonding head 106, is used to hot-press the liquid crystal driver IC 103 along with the anisotropic conductive film 105 towards the transparent substrate 102. Heat applied by the thermocompression bonding head 106 causes a thermosetting reaction in the anisotropic conductive film 105, thereby connecting the liquid crystal driver IC 103 onto the transparent electrodes 102.

In mounting the liquid crystal driver IC 103 to the transparent substrate 101, in order to accurately connect the transparent electrodes 102 formed on the transparent substrate 101 to the connecting electrodes 104 formed on the mounting surface of the liquid crystal driver IC 103, alignment is performed in advance.

To perform alignment, a camera disposed on the back surface-side of the transparent substrate 101 is used to capture an image of alignment marks provided on both the transparent substrate 101 and the mounting surface of the liquid crystal driver IC 103, positioning is determined on the basis of the captured image and the substrate and electronic component are moved on the basis of this determination. By registering the alignment marks in advance and matching a registered image with the captured image by using image processing such as gray search or binary methods, it is possible to obtain positioning information.

PRIOR ART LITERATURE

Patent Literatures

PLT 1: Japanese Unexamined Patent Application Publication No. 2005-26577

SUMMARY OF THE INVENTION

Problem to be Solved by the Invention

In recent years, along with size reductions and advanced functionality in liquid crystal displays and other electronics, and along with size reductions and advanced functionality in electronic components, there has been progress in finer pitches such as in circuit substrate wiring pitches and electronic component connecting terminal pitches. In the case of using an anisotropic conductive film to COG-connect an electronic component such as an IC chip to a circuit substrate having a reduced electrode pitch, in order to certainly sandwich the conductive particles to ensure conduction in the case of narrowed intervals between electrode terminals, filling the conductive particles at a high density is necessary.

However, by filling the conductive particles at a high density, when aligning the electronic component with respect to the circuit substrate, it is difficult to read alignment marks on the surface of the circuit substrate and on the mounting surface of the electronic component through the anisotropic conductive film with the camera arranged on the back side of the circuit substrate and alignment accuracy might be lowered. Because conductive particles filled at a high density agglomerate in parts of the film and, among other problems, cause inconsistent alignment mark recognition, alignment marks are typically arranged so as to avoid anisotropic conductive film pasting sites. In the case of forming a substrate-side alignment mark thus outside of the pasting locations for the anisotropic conductive film, the alignment mark is further from the connection positions of the electrode terminals and is insufficient for improvements in alignment accuracy for fine-pitched electrode terminal intervals; furthermore, providing the alignment mark outside of mounting areas on the circuit substrate constrains pattern designs.

Furthermore, in the case of low alignment accuracy, because misalignment occurs in a planer direction between opposing electrode terminals in anisotropic connections, problems occur in which the number of sandwiched conductive particles and the area in which they are sandwiched to provide electrical conduction are reduced. Still further, because intervals between adjacent electrode terminals are reduced by finer pitches, in the case of low alignment accuracy, problems such as a connection (short circuit) occurring between intended electrode terminals and adjacent electrode terminals are also a concern.

Therefore, an object of the present disclosure is to provide an alignment method, a method for connecting an electronic component, a method for manufacturing a connection body, a connection body, and an anisotropic conductive film for COG connection processes using anisotropic conductive film having conductive particles filled at a high density in which alignment marks are provided in areas overlapping pasting areas of the anisotropic conductive film while allowing high-accuracy alignment using images captured by a camera.

Solution to Problem

In order to solve the aforementioned problems, an alignment method according to the present disclosure comprises mounting an electronic component having a component-side alignment mark onto a surface of a transparent substrate having a substrate-side alignment mark via an adhesive agent containing conductive particles interposed therebetween; imaging the substrate-side alignment mark and the electronic component-side alignment mark from the back surface side of the transparent substrate; and adjusting a position of the substrate-side alignment mark and the component-side alignment mark by using a captured image obtained by imaging to adjust a mounting position of the electronic component with respect to the transparent substrate; wherein the adhesive agent has the conductive particles arranged regularly as viewed from a planar perspective; and wherein in the captured image, outside edges of the substrate-side alignment mark or the component-side alignment mark exposed between the conductive particles are intermittently visible as line segments along imaginary line segments of the outside edges of the substrate-side alignment mark or the component-side alignment mark.

Further, a method for connecting an electronic component according to the present disclosure comprises mounting an electronic component having a component-side alignment mark onto a surface of a transparent substrate having a substrate-side alignment mark via an adhesive agent containing conductive particles interposed therebetween; imaging the substrate-side alignment mark and the electronic component-side alignment mark from the back surface side of the transparent substrate; and adjusting a position of the substrate-side alignment mark and the component-side alignment mark by using a captured image obtained by imaging to adjust a mounting position of the electronic component with respect to the transparent substrate before connecting the electronic component; wherein the adhesive agent has the conductive particles arranged regularly as viewed from a planar perspective; and wherein in the captured image, outside edges of the substrate-side alignment mark or the component-side alignment mark exposed between the conductive particles are intermittently visible as line segments along imaginary line segments of the outside edges of the substrate-side alignment mark or the component-side alignment mark.

Still further, a method for manufacturing a connection body according to the present disclosure comprises mounting an electronic component having a component-side alignment mark onto a surface of a transparent substrate having a substrate-side alignment mark via an adhesive agent containing conductive particles interposed therebetween; imaging the substrate-side alignment mark and the electronic component-side alignment mark from the back surface side of the transparent substrate; and adjusting a position of the substrate-side alignment mark and the component-side alignment mark by using a captured image obtained by imaging to adjust a mounting position of the electronic component with respect to the transparent substrate before connecting the electronic component to manufacture a connection body in which the electronic component is connected to the transparent substrate; wherein the adhesive agent has the conductive particles arranged in a regular pattern as viewed from a planar perspective; and wherein in the captured image, outside edges of the substrate-side alignment mark or the component-side alignment mark exposed between the conductive particles are intermittently visible as line segments along imaginary line segments of the outside edges of the substrate-side alignment mark or the component-side alignment mark.

Yet further, a connection body according to the present disclosure is manufactured by the method described above.

Even further, an anisotropic conductive film according to the present disclosure comprises conductive particles arranged regularly as viewed from a planar perspective; wherein area density of the conductive particles is less than 50% per unit area.

Advantageous Effects of Invention

According to the present disclosure, because the conductive particles are arranged in a regular arrangement as viewed from a planar perspective, even in the case of the conductive particles overlapping the imaginary line segments, the alignment marks exposed between the conductive particles are intermittently visible as line segments on outside edges. Therefore, outside edges of the alignment mark can be accurately recognized from a contrast or color difference at boundaries of these intermittently appearing line segments and position coordinates of the electronic component with respect to the transparent substrate can be discerned with a high accuracy by using a selected image processing. Thereby, even in the case of imaging an alignment mark via an adhesive agent filled at a high density with the conductive particles, high-accuracy position detection is enabled.

DESCRIPTION OF EMBODIMENTS

Figure 1:
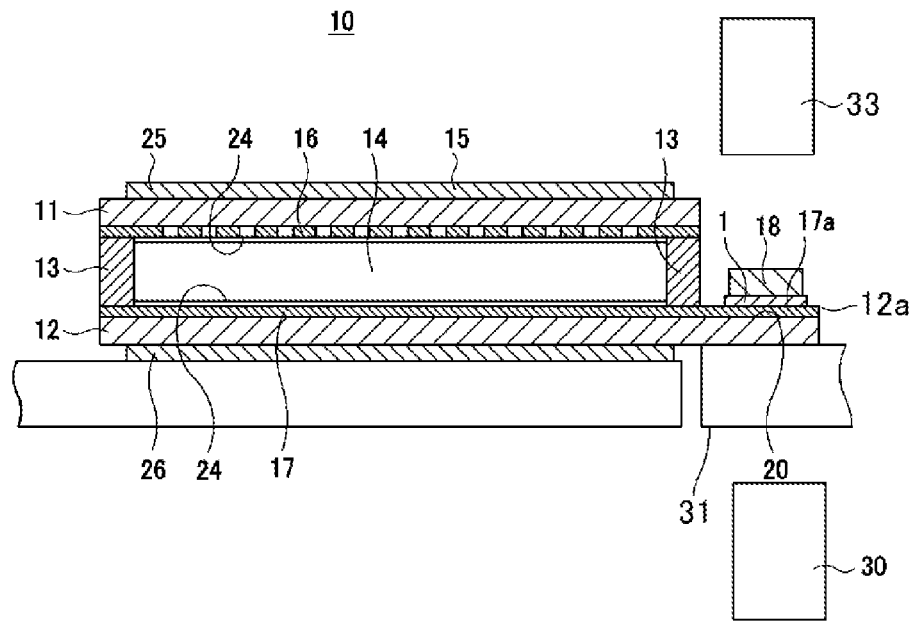
FIG. 1 is a cross-sectional view illustrating one example of a connection body of a liquid crystal display panel.

Hereinbelow, an alignment method, a method for connecting an electronic component, a method for manufacturing a connection body, a connection body and an anisotropic conductive film according to the present disclosure will now be more particularly described with reference to the accompanying drawings. It should be noted that the present disclosure is not limited to the embodiments described below and various modifications can be made without departing from the scope of the present invention. The features shown in the drawings are illustrated schematically and are not intended to be drawn to scale. Actual dimensions should be determined in consideration of the following description. Moreover, those skilled in the art will appreciate that dimensional relations and proportions may be different among the drawings in some parts.

Connection Body: Liquid Crystal Display Panel

Now, the alignment method according to the present disclosure in which an electronic component is connected to a transparent substrate as a COG-connected connection body will be described in an example in which, as the electronic component, an IC chip for use as a liquid crystal display panel driver is mounted to a glass substrate of a liquid crystal display panel. As illustrated in FIG. 1, a liquid crystal display panel 10, in which two transparent substrates 11, 12 made from a material such as a glass substrate are arranged in opposition and these transparent substrates 11, 12 are joined together by a seal 13 which is frame-shaped. In the liquid crystal display panel 10, a panel display component 15 is then formed by sealing a liquid crystal 14 within a space enclosed by the transparent substrates 11, 12.

On both inner surfaces of the transparent substrates 11, 12 opposing each other, a pair of transparent electrodes 16, 17 are formed from, for example, ITO (indium tin oxide) in a stripe pattern in mutually intersecting directions. Both of the transparent electrodes 16, 17 are configured so that a pixel, as the minimum unit of the liquid crystal display, is constituted by intersecting portions of both of the transparent electrodes 16, 17.

Among both of the transparent substrates 11, 12, one transparent substrate 12 is formed to be larger than the other transparent substrate 11 in planar dimensions, and in an edge area 12a of the transparent substrate 12 formed to be larger, a COG mounting portion 20 is provided on which a liquid crystal driver IC 18 is mounted as the electronic component. On the COG mounting portion 20, a substrate-side alignment mark 21 is provided which is to be superimposed with an IC-side alignment mark 22 provided on the liquid crystal driver IC 18.

Figure 2:
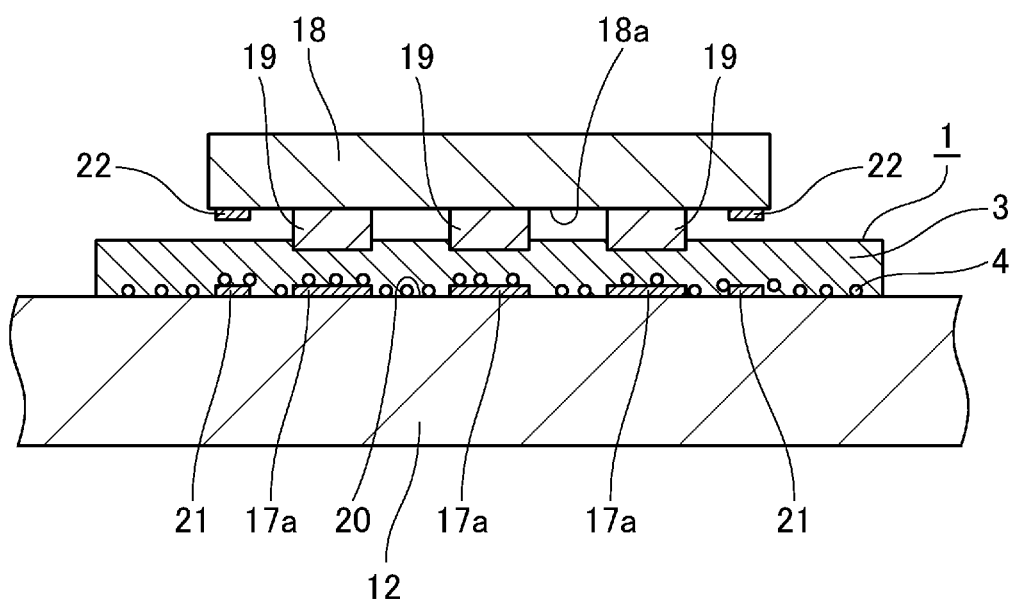
FIG. 2 is a cross-sectional view illustrating an alignment step of a liquid crystal driver IC and a transparent substrate.

It should be noted that the liquid crystal driver IC 18, by selectively applying a liquid crystal driving voltage to the pixel, can partially change liquid crystal orientation to perform a selected liquid crystal display. As illustrated in FIG. 2, the liquid crystal driver IC 18 has a mounting surface 18a which faces the transparent substrate 12 and on which electrode terminals 19 are formed for electrically connecting to terminal portions 17a of the transparent substrate 17. Furthermore, on the mounting surface 18a of the liquid crystal driver IC 18, the IC-side alignment mark 22 is formed for performing alignment with respect to the transparent substrate 12 by superimposition with the substrate-side alignment mark 21.

Alignment Mark

Figure 3:
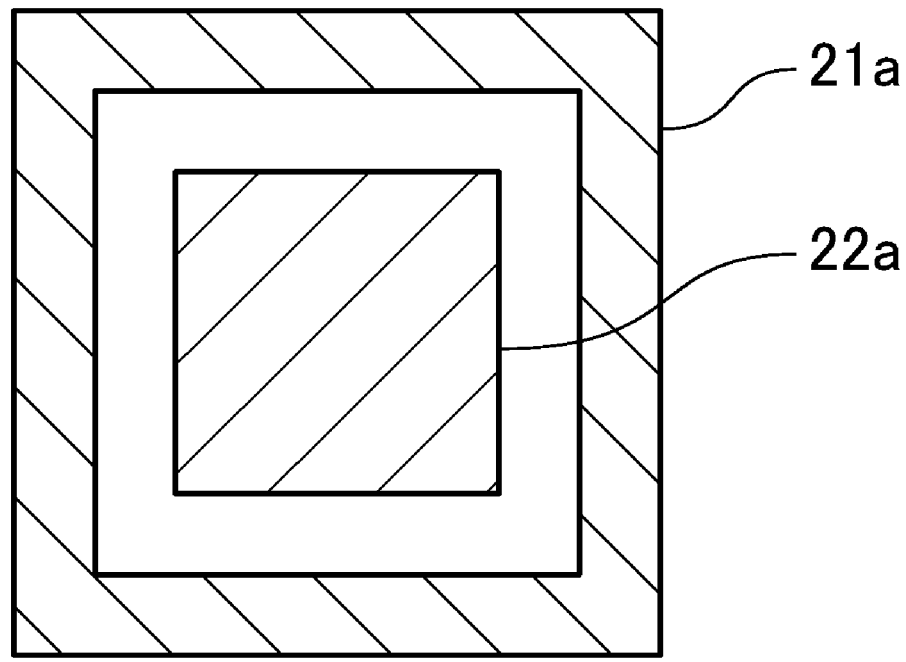
FIG. 3 is a view illustrating an IC-side alignment mark and a substrate-side alignment mark in a state in which alignment is correct.

The substrate-side alignment mark 21 and the IC-side alignment mark 22 comprise, for example, an outer mark and an inner mark to be positioned within the outer mark. As illustrated FIG. 3, on the transparent substrate 12, for example, an outer mark 21a is formed as the substrate-side alignment mark 21 in a square shape having a square-shaped open area; on the liquid crystal driver IC 18, for example, an inner mark 22a is formed as the IC-side alignment mark 22 in a square shape capable of fitting within the square-shaped open area of the outer mark 21a.

Then, in the alignment step described below, by moving the liquid crystal driver IC 18 so that the inner mark 22a fits within the square-shaped open area of the outer mark 21a, the terminal portions 17a of the transparent electrodes 17 formed on the transparent substrate 12 and the electrode terminals 19 formed on the mounting surface 18a of the liquid crystal driver IC 18 are aligned.

It should be noted that, as the substrate-side alignment mark 21 and the IC-side alignment mark 22, in addition to inner and outer marks, a variety of marks can be used which can be combined together to align the transparent substrate 12 and the liquid crystal driver IC 18. Furthermore, dimensions of the substrate-side alignment mark 21 and the IC-side alignment mark 22 are without particular limitation and can be formed, for example, having 100 to 300 µm square dimensions.

Furthermore, the substrate-side alignment mark 21 and IC-side alignment mark 22, so long as the shapes thereof can be superimposed and recognized, are without particular limitation and a variety of those known can be used. Still further, pluralities of both of the substrate-side alignment mark 21 and the IC-side alignment mark 22 may be provided to facilitate high-accuracy two-dimensional alignment. These pluralities of alignment marks may have different shapes. Differing shapes facilitate recognition. Moreover, visibility may be improved in the substrate-side alignment mark 21 and IC-side alignment mark 22 by applying color.

The terminal portion 17a of the transparent electrode 17 is formed on the COG mounting portion 20. Above the terminal portion 17a, the liquid crystal driver IC 18 is connected by using an anisotropic conductive film 1 as a circuit connecting adhesive agent. The anisotropic conductive film 1 contains conductive particles 4 and is for electrically connecting, via the conductive particles 4, the electrode terminals 19 of the liquid crystal driver IC 18 to the terminal portions 17a of the transparent electrodes 17 formed on the edge area 12a of the transparent substrate 12. In the anisotropic conductive film 1, a binder resin flows due to thermocompression bonding with the thermocompression bonding head 33 and the conductive particles 4 are deformed between the terminal portions 17a and the electrode terminals 19 of the liquid crystal driver IC 18 and the binder resin is cured in this state. The anisotropic conductive film 1 thus mechanically and electrically connects the transparent substrate 12 and the liquid crystal driver IC 18.

Further, on both the transparent electrodes 16, 17, an orientation film 24 that is subjected to a predetermined rubbing treatment is formed and an initial orientation of the liquid crystal molecules is regulated by this orientation film 24. Still further, a pair of polarizing plates 25, 26 are disposed on the outer surfaces of the transparent substrates 11, 12; these polarizing plates 25, 26 regulate the wave-direction of transmitted light from a light source such as a backlight (not illustrated).

Anisotropic Conductive Film

Figure 4:
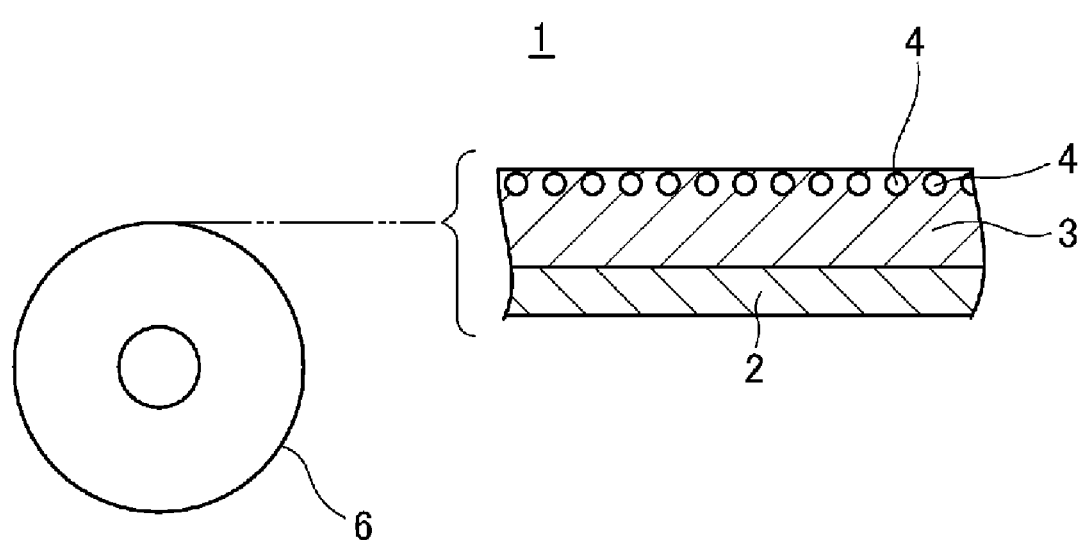
FIG. 4 is a cross-sectional view illustrating an anisotropic conductive film.

Next, the Anisotropic Conductive Film 1 will be described. In the anisotropic conductive film (ACF) 1, as illustrated in FIG. 4, typically, a binder resin layer (adhesive layer) 3 containing the conductive particles 4 is formed on a release-treated film 2 serving as a matrix material. The anisotropic conductive film 1 is an adhesive agent of a thermosetting-type or a photocurable-type such as by ultraviolet light and is pasted onto the transparent electrodes 17, which are formed on the transparent substrate 12 of the liquid crystal display panel 10, along with mounting the liquid crystal driver IC 18; flowing is caused by thermo-compression-bonding by the thermocompression bonding head 33 and the conductive particles 4 are deformed between the terminal portions 17a of the respectively opposing transparent electrodes 17 and the electrode terminals 19 of the liquid crystal driver IC 18; heat is then applied or ultraviolet light is irradiated in order to cure the resin in a state in which the conductive particles are deformed.

Further, in the anisotropic conductive film 1, in the binder resin layer 3 which contains, as typical, a film-forming resin, a thermosetting resin, a latent curing agent and a silane coupling agent, the conductive particles 4 are arranged regularly in a predetermined pattern.

The release-treated film 2 for supporting the binder resin layer is formed by coating, for example, PET (polyethylene terephthalate), OPP (oriented polypropylene), PMP (poly-4-methylpentene-1), PTFE (polytetrafluoroethylene), among others, with a release agent such as silicone, and is for preventing drying of the anisotropic conductive film 1 and maintaining the shape of the anisotropic conductive film 1.

As the film-forming resin contained by the binder resin layer 3, a resin having an average molecular weight of approximately 10,000 to 80,000 is preferably used. Examples of film forming resin include epoxy resin, modified epoxy resin, urethane resin and phenoxy resin, among a variety of other resins. Among these, in view of such properties as film-formed state and connection reliability, a phenoxy resin is particularly preferable.

Examples of thermosetting resins, without particular limitation, include commercially available epoxy resins and acrylic resins.

Examples of epoxy resin include, without particular limitation, naphthalene-type epoxy resin, biphenol-type epoxy resin, phenol-novolac type epoxy resin, bisphenol type epoxy resin, stilbene-type epoxy resin, triphenolmethane-type epoxy resin, phenol aralkyl-type epoxy resin, naphthol-type epoxy resin, dicyclopentadiene-type epoxy resin and triphenylmethane-type epoxy resin, among others. These may be used individually or in a combination of two or more.

Acrylic resin is without particular limitation and an acrylic compound and/or a liquid acrylate, among others, may be selected as appropriate according to purpose. Examples include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxy propane, 2,2-bis[4-(acryloxy) phenyl]propane, 2,2-bis[4-(acryloxy ethoxy) phenyl] propane, dicyclopentenyl acrylate, tricyclodecanyl acrylate, tris(acryloxyethyl) isocyanurate, urethane acrylate and epoxy acrylate, among others. It should be noted that methacrylate may be substituted for acrylate. These may be used individually or in a combination of two or more.

The latent curing agent is without particular limitation and examples include thermosetting and UV-curing types, among a variety of other types of curing agents. The latent curing agent does not react under normal conditions and a trigger including heat, light and/or pressure, among others, for activation/initiating a reaction can be selected according to need. Existing methods for activating a heat activated latent curing agent include methods in which active species (cations, anions and/or radicals) are generated by a dissociative reaction due to heat, methods in which the curing agent is stably dispersed in the epoxy resin, the curing agent becomes compatible with and dissolves in the epoxy resin at high temperatures and the curing reaction is initiated, methods in which a molecular sieve enclosed type curing agent is dissolved at a high temperature to initiate the curing reaction and methods in which is microcapsules are dissolved to cure, among other methods. Examples of latent curing agents include imidazole-type, hydrazide-type, boron trifluoride-amine complexes, sulfonium salt, aminimide, polyamine salt and dicyandiamide, among others, and modified compounds of these; these may be used individually or in a combination of two or more. Among these, a microcapsule imidazole-type latent curing agent is particularly suitable.

The silane coupling agent is without particular limitation and examples include epoxy-type, amino-type, mercapto sulfide-type, and ureido-type, among others. By adding the silane coupling agent, adhesion properties at interfaces between organic and inorganic materials can be improved.

Conductive Particles

Examples of conductive particles 4 usable in the anisotropic conductive film 1 include known conductive particles used in anisotropic conductive films. As the conductive particles 4, examples include particles of metals or metal alloys such as those of nickel, iron, copper, aluminum, tin, lead, chromium, cobalt, silver or gold and particles such as those of metal oxides, carbon, graphite, glass, ceramics and plastics coated with metal, or these particles having a further coating of a thin electrically-insulating film, among others. In the case of coating a metal to the surface of resin particles, examples of usable resin particles include phenol resin, acrylic resin, acrylonitrile-styrene (AS) resin, benzoguanamine resin, divinylbenzene-type resin and styrene-type resin particles, among others.

Regular Arrangement of Conductive Particles

Figure 5:
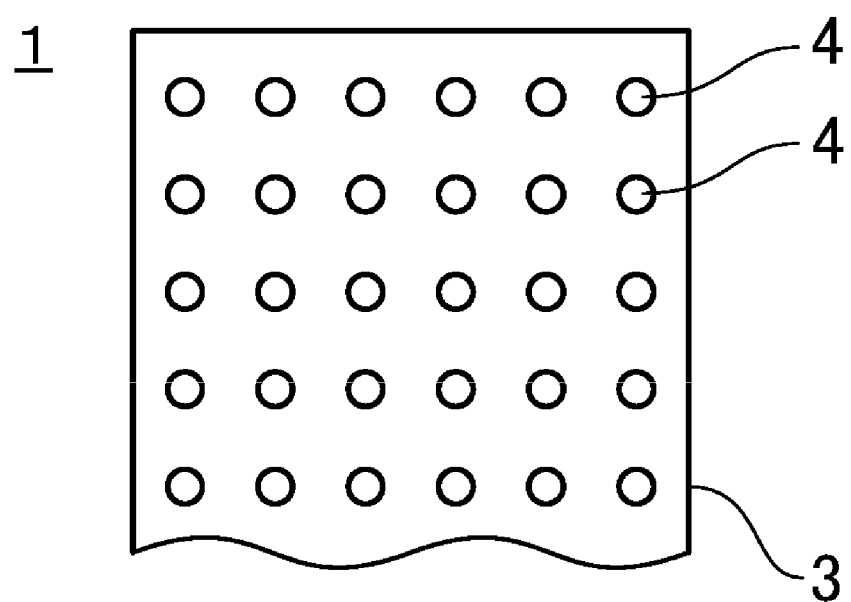
FIG. 5 is a plan view illustrating an anisotropic conductive film in which conductive particles are regularly arranged in a grid pattern.

In the anisotropic conductive film 1, the conductive particles 4 are regularly arranged in a predetermined array pattern as viewed from a planar perspective which is, for example as illustrated in FIG. 5, a uniformly spaced grid array. By arranging the conductive particles 4 in a regular array pattern as viewed from a planar perspective, even in the case of the conductive particles 4 being filled at a high density in the anisotropic conductive film 1, the imaging camera 30 is able to identify the alignment marks. The uniformly spaced array pattern arrangement of the conductive particles 4, as viewed from a planar perspective, can be selected from, for example, tetragonal lattice and hexagonal lattice patterns, among others. So as not to inhibit visibility, the conductive particles 4 may be dispersed within a single, same layer; however, in view of ensuring visibility, the conductive particles 4 are preferably arranged in an array. The alignment step is described in detail further below.

Further, in the anisotropic conductive film 1, regularly arranging the conductive particles 4 prevents unevenness in density due to agglomeration of the conductive particles 4, even in the case of filling the binder resin layer 3 at a high density. Therefore, in the anisotropic conductive film 1, the conductive particles 4 can be trapped even in the case of the terminal portion 17a and the electrode terminals 19 having reduced pitches, and short circuits caused by aggregation of the conductive particles 4 can be prevented between terminals even in the case of narrowed distances between adjacent electrodes.

Preferably, in the anisotropic conductive film 1, an area density of the conductive particles 4 per unit area is less than 50%, more preferably 45% or less, still more preferably 40% or less, and yet more preferably 35% or less. If the density of the conductive particles 4 exceeds this area density, transmittance is lowered by the conductive particles 4 and visibility of the alignment marks 21, 22 through the anisotropic conductive film 1 cannot be ensured.

Such an anisotropic conductive film 1 can be manufactured by, for example, arranging the conductive particles 4 in a selected array pattern on a substrate before transferring the conductive particles 4 to the binder resin layer 3 supported by the release-treated film 2, or supplying the conductive particles 4 via an arrangement plate, on which openings are provided corresponding to the array pattern, to the binder resin layer 3 supported by the release-treated film 2.

It should be noted that the shape of the anisotropic conductive film 1 is without particular limitation, and, for example, as illustrated in FIG. 4, can be a long, tape shape windable in a winding reel 6 that can be used by cutting to a selected length.

In the embodiment described above, as the anisotropic conductive film 1, a film-formed adhesive film made of a thermosetting resin composition containing the binder resin layer 3 in which the conductive particles 4 are dispersed is described as an example; however, the adhesive agent according to the present disclosure is not limited thereto, and, for example, a configuration is possible in which an insulating adhesive agent layer containing only the binder resin layer 3 is laminated with a conductive particle-containing layer containing the binder resin layer 3 which contains the conductive particles 4. Furthermore, in the anisotropic conductive film 1, so long as the conductive particles 4 are arranged regularly as viewed from a planar perspective, in addition to being arranged regularly in a single layer as illustrated in FIG. 2, the conductive particles 4 may be arranged regularly in an array as viewed from a planar perspective in a plurality of binder resin layers 3. Moreover, in at least one layer in a multilayer configuration of the anisotropic conductive film 1, the conductive particles 4 may be dispersed at a single, selected distance.

Method for Manufacturing Connection Body

Next, steps for manufacturing a connection body, in which the liquid crystal driver IC 18 is connected to the transparent electrodes 17 of the glass substrate 12 via the anisotropic conductive film 1, will now be described. First, the anisotropic conductive film 1 is temporarily pressure bonded onto the transparent electrodes 17. To temporarily pressure bond the anisotropic conductive film 1, the anisotropic conductive film 1 is positioned on the transparent electrodes 17 of the transparent substrate 12 so that the binder resin layer 3 is on the transparent electrode 17 side.

After arranging the binder resin layer 3 on the transparent electrodes 17, heat and pressure are applied to the binder resin layer 3 from the release-treated film 2 side by a temporary pasting-use thermocompression head, the thermocompression head is removed from the release-treated film 2, and the release-treated film 2 is peeled from the binder resin layer 3 that is on the transparent electrodes 17 so that only the binder resin layer 3 is temporarily pasted on the transparent electrodes 17. Temporary pressure bonding with the thermocompression head is performed by applying a light pressure (for example approximately 0.1 to 2 MPa) to the top surface of the release-treated film 2 towards the transparent electrodes 17 while heating (for example at approximately 70 to 100° C.).

Alignment Method

Next, the transparent substrate 12 having the binder resin layer temporarily pasted thereon is placed onto a transparent stage 31; the transparent substrate 12 and the liquid crystal driver IC 18 are aligned so that the transparent electrodes 17 of the transparent substrate 12 and the electrode terminals 19 of the liquid crystal driver IC 18 face each other with the binder resin layer 3 interposing therebetween.

In alignment, an imaging camera 30 disposed on the back surface-side of the transparent substrate 12 is used to capture an image of the alignment marks 21, 22 provided respectively on the transparent substrate 12 and the mounting surface 18a of the liquid crystal driver IC 18, positioning is determined on the basis of the captured image and the liquid crystal driver IC 18 is moved on the basis of this determination. By registering the alignment marks 21, 22 in advance and matching a registered image with the captured image using image processing such as gray search or binary methods, it is possible to obtain positioning information.

The substrate-side alignment mark 21 is imaged through the transparent stage 31 and the transparent substrate 12, and the IC-side alignment mark 22 is imaged through the transparent stage 31, the transparent substrate 12 and the binder resin layer 3 in which the conductive particles 4 are arranged in an array at a high density. In order to perform high-accuracy alignment, it is necessary to detect the positions of each of the alignment marks 21, 22 at a high accuracy; therefore, it is necessary for outside edges, which are the boundaries of each of the alignment marks 21, 22, to be distinguishable in the captured image. When the alignment marks 21, 22 are imaged, a contrast difference is generated at boundaries of the outside edges between a side in which an alignment mark is provided and a side in which an alignment mark is not provided; alignment-mark position, and thus the position of the liquid crystal driver IC 18 with respect to the transparent substrate 12, can be determined on the basis of this contrast difference.

Figure 6:
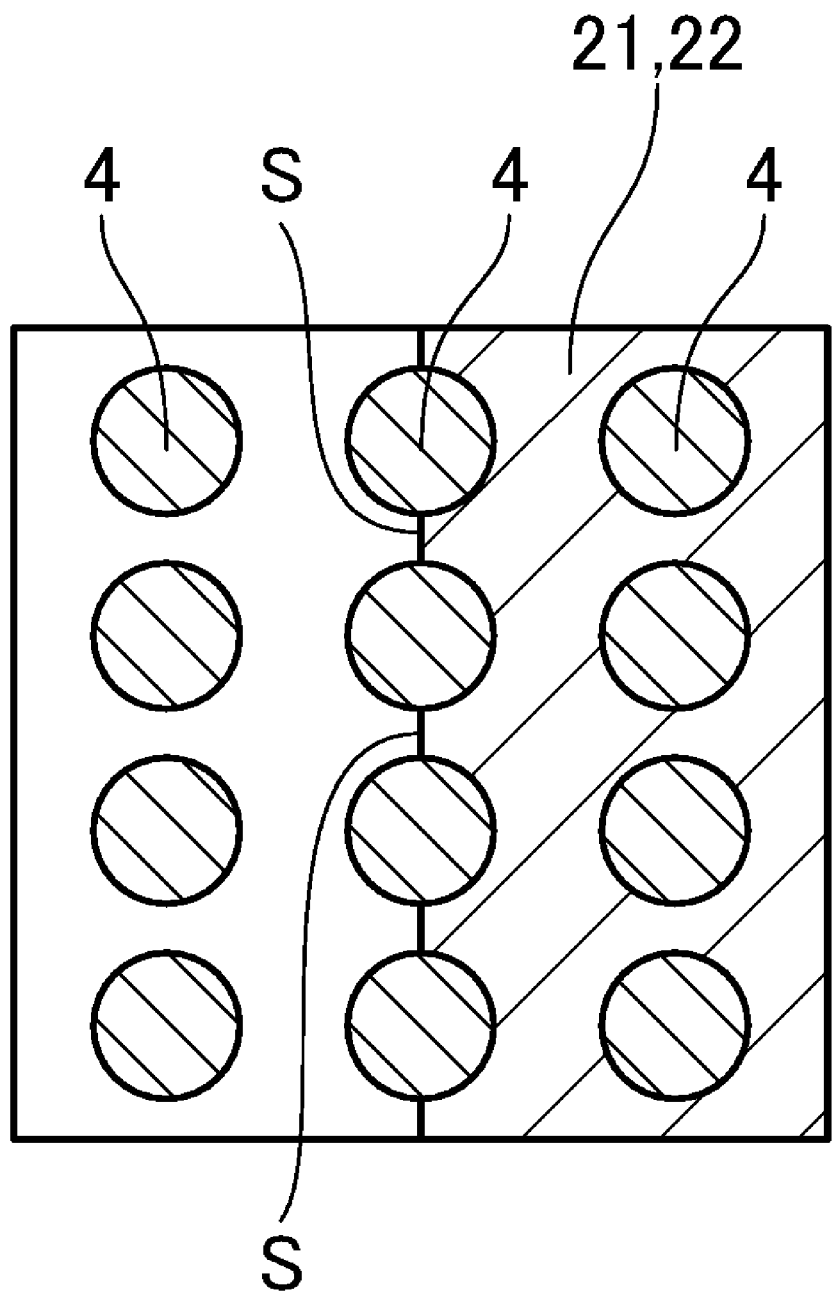
FIG. 6 is a view illustrating an image of an imaging camera in an alignment method according to the present disclosure.

In the alignment step according to the present disclosure, as illustrated in FIG. 6, in the captured image of the substrate-side alignment mark 21 and the IC-side alignment mark 22 captured by the imaging camera 30, the substrate-side alignment mark 21 and the IC-side alignment mark 22 exposed between the conductive particles 4 are intermittently visible as line segments S along imaginary line segments constituting the outside edges of the substrate-side alignment mark 21 or the IC-side alignment mark 22. As described above, in the anisotropic conductive film 1, by area density of conductive particles 4, which are arranged regularly, per unit area being less than 50%, transmittance of the anisotropic conductive film 1 and visibility of the alignment marks 21, 22 can be ensured.

It should be noted that, in this case, unit area per conductive particle is preferably 0.7 to 1,300 μm², more preferably 1.8 to 750 μm² and still more preferably 4.2 to 350 μm².

Number density of the conductive particles 4 is preferably 50 to 450,000 particles/mm², more preferably 300 to 300,000 particles/mm² and still more preferably 500 to 120,000 particles/mm².

In this case, to be within a range providing adequate visibility for alignment, unit area is preferably an area of approximately 0.7×0.7 mm, more preferably an area of approximately 1×1 mm and still more preferably an area of approximately 2 mm×2 mm.

Figure 7:
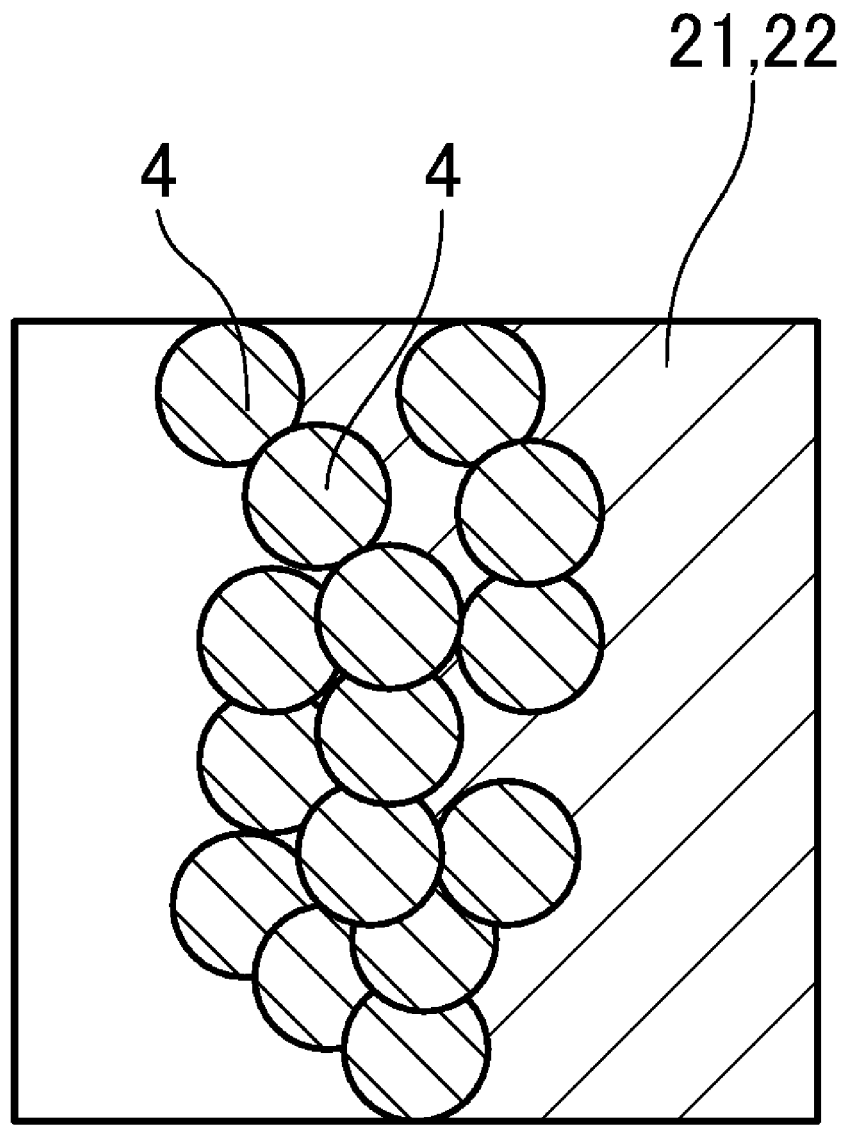
FIG. 7 is a view illustrating an image of am imaging camera in an alignment method using an anisotropic conductive film in which conductive particles are randomly arranged.
Figure 8A:
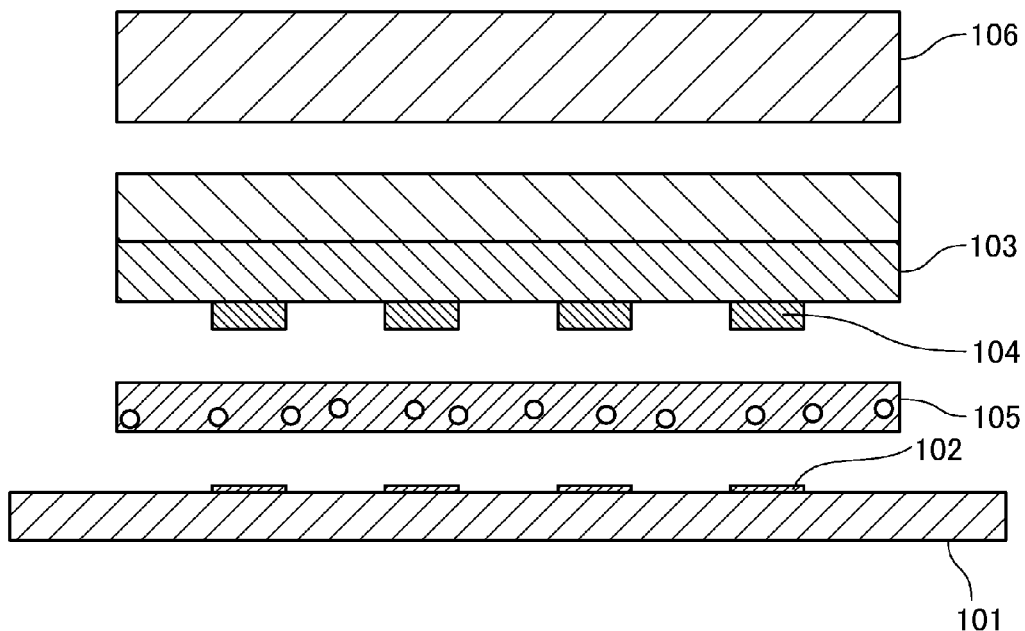
FIGS. 8A and 8b are cross-sectional views illustrating a step in which an IC chip is connected to a transparent substrate of a liquid crystal display panel.
Figure 8B:
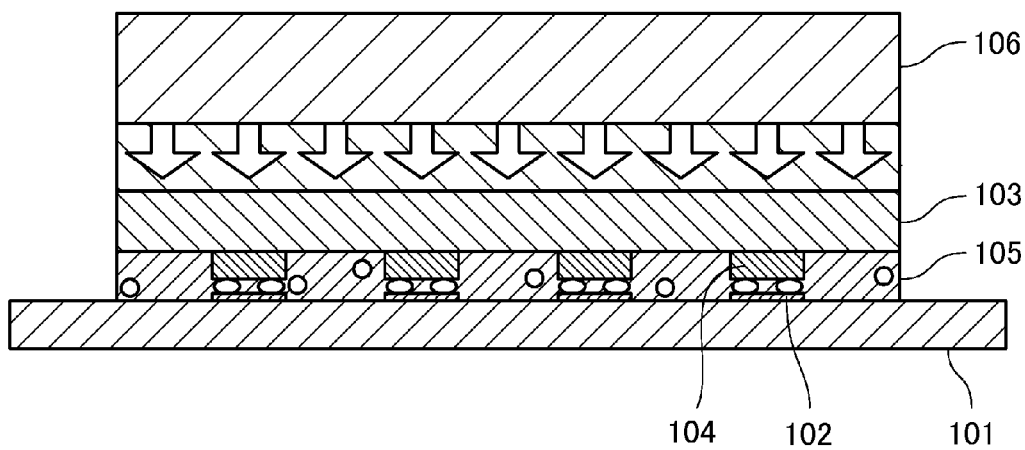

The imaginary line segments constituting the outside edges of each of the alignment marks 21, 22 are line segments constituting the outside edges of the alignment marks 21, 22 which are deduced from contrast appearing between locations in which the alignment marks 21, 22 are formed and locations in which the alignment marks 21, 22 are not formed. In the captured image, in the case of the conductive particles 4 arranged at a high density overlapping each other above the imaginary line segments, because the outlines of the relevant conductive particles 4 also generate a contrast difference, it is impossible to perceive the outside edge of the alignment mark 21 and 22 as a continuous line and it is impossible to correctly detect positioning using only the imaginary line segments. Particularly, as illustrated in FIG. 7, in the case of using an anisotropic conductive film 1 in which the conductive particles 4 are dispersed randomly in the binder resin layer 3, the conductive particles 4 agglomerate in portions and, in the case of these agglomerated particles overlapping the outside edges of the alignment marks 21, 22, recognizing the imaginary line segments is difficult.

In this regard, in the alignment step according to the present disclosure, as described above, because the conductive particles 4 are arranged regularly as viewed from a planar perspective, even in the case of the conductive particles 4 overlapping the imaginary line segments, the substrate-side alignment mark 21 and the IC-side alignment mark 22 exposed between the conductive particles 4 are intermittently visible as line segments S along imaginary line segments on the outside edges of the substrate-side alignment mark 21 or the IC-side alignment mark 22.

Therefore, in imaging resolution of the two alignment marks 21 and 22, visibility is enabled because the conductive particles 4 do not aggregate, in other words, the IC side alignment mark 22 is visible through the anisotropic conductive film 1. Thus, at a magnification enabling visual recognition of both alignment marks 21, 22, in the anisotropic conductive film 1, a state in which the conductive particles 4 are, for example, interspersed in an array, is ensured across the entire surface in a state that is more macroscopic than both the alignment marks 21, 22.

Thus, in the alignment step according to the present disclosure, the line segments S which appear intermittently can be accurately recognized, the outside edges of the substrate-side alignment mark 21 and the IC-side alignment mark 22 can be discerned and position coordinates of the liquid crystal driver IC 18 with respect to the transparent substrate 12 can be identified with a high accuracy using a desired image processing such as gray search or binary method. Subsequently, by referring to the coordinate data of the transparent electrodes 17 of the transparent substrate 12 and the electrode terminals 19 of the liquid crystal driver IC 18, position of the liquid crystal driver IC 18 with respect to the transparent substrate 12 is adjusted.

Thus, even in the case of imaging the IC-side alignment mark 22 via the anisotropic conductive film 1, position of the liquid crystal driver IC 18 can be accurately detected. The substrate-side alignment mark 21 is arranged at a position nearly overlapping the IC-side alignment mark 22 so that alignment can be performed with the both alignment marks 21, 22 having a predetermined positional relationship. Therefore, the terminal portions 17a of the transparent electrodes 17 and the electrode terminals 19 of the liquid crystal driver IC 18 having reduced pitches can be aligned with a high accuracy.

It should be noted that the line segments S exposed between the conductive particles 4 on outside edges of the alignment marks 21, 22, so long as being intermittently visible, are not required to each have the same length. Furthermore, in the imaging camera 30 for imaging both alignment marks, a solid state image sensor such as a CCD may be used. In the case of a resolution of the imaging camera 30 being equivalent to or finer than the average particle diameter of the conductive particles 4, even in the case of the conductive particles 4 overlapping the outside edges of alignment marks 21, 22, the line segments of the outside edges exposed between the conductive particles 4 can be discerned. It should be noted that in the case of the resolution of the imaging camera 30 being courser than the average particle diameter of the conductive particles 4, because the conductive particles 4 arranged in an array cannot be recognized from a planar perspective, the resolution needed to recognize the alignment mark is not affected.

By detecting the alignment marks 21, 22 with such a resolution, in the alignment step according to the present disclosure, size reductions of the alignment marks 21, 22 to sizes in the order of several tens of micrometers are enabled, thereby reducing constraints on both the transparent substrate 12 and the liquid crystal driver IC 18 caused by the alignment marks and leading to a greater degree of freedom in electrode pattern design.

Lengths of Line Segments Exposed Between Conductive Particles

In the image captured by the imaging camera 30, lengths of the line segments S of the alignment marks 21, 22 exposed between the conductive particles 4 have lengths of approximately several tens to several hundreds of micrometers. Furthermore, the line segments S exposed between the conductive particles 4 on outside edges of the alignment marks 21, 22 have a length allowing recognition as line segments, and if total length of the line segments in the captured image is 25% or more and preferably 33% or more of the length of imaginary line segments, the outside edges of the alignment marks 21, 22 can be discerned. This is because the conductive particles 4 arranged in an array make it possible to practically recognize the interrupted line segment as a line obtained by extending the line segment. The conductive particles 4 being present in a single and same layer, in other words, within a single and same plane, at a selected single distance, can achieve an effect similar to the above; however, arrangement in an array makes the above recognition predictable, leading to an advantageous effect in simplifying software processing. Then, using the captured image, by performing a selected image processing, position coordinates of the liquid crystal driver IC 18 with respect to the transparent substrate 12 can be identified with high accuracy.

Area Between Conductive Particles of 50% or More/Area Occupied by the Conductive Particles of Less than 50%

Preferably, in the captured image of the imaging camera 30, area between the conductive particles 4 is more than 50%, preferably 55% or more, more preferably 60% or more and still more preferably 65% or more; thus, area occupied by the conductive particles 4 is less than 50%, preferably 45% or less, more preferably 40% or less, and still more preferably 35% or less. If the particles 4 are arranged to exceed this density, in the image captured by the imaging camera 30, recognizing the line segments S exposed between the conductive particles 4 from the contrast difference at boundaries and to discern them as the outside edges of the alignment marks 21, 22 is difficult, thereby precluding high-accuracy position detection.

Final Pressure Bonding Step

After the alignment step, by using a thermocompression head 33 heated to a selected temperature for curing the binder resin layer 3 at a selected pressure and time, the liquid crystal driver IC 18 is thermocompression-bonded from above. The binder resin of the anisotropic conductive film 1 thus exhibits flowability, and, while the binder resin flows from between the electrode terminals 19 of the liquid crystal driver IC 18 and the terminal portions 17a of the transparent substrate 12, the conductive particles 4 within the binder resin layer 3 are sandwiched and deformed between the electrode terminals 19 and the terminal portions 17a.

Consequently, the electrode terminals 19 of the liquid crystal driver IC 18 and the terminal portions 17a of the transparent substrate 12 are electrically connected via the conductive particles 4 and, in this state, the binder resin 3 is cured by heating with a compression bonding tool. The conductive particles 4 which are not between the electrode terminals 19 and the terminal portions 17a are dispersed within the binder resin and are maintained in an electrically insulated state. Electrical conduction between only the electrode terminals 19 and the terminal portions 17a is thus achievable.

It should be noted that, by using a fast curing type radical polymerization reaction type as the binder resin, it is possible to rapidly cure the binder resin with a short heating time. Additionally, the anisotropic conductive film 1 is not limited to thermosetting types and as long as pressure can be used in connection, a photosetting type or a thermo/photosetting type adhesive agent can be used.

EXAMPLES

Examples of the present disclosure will now be described. In the present examples, anisotropic conductive films in which conductive particles were regularly arranged and anisotropic conductive films in which conductive particles were randomly arranged were used to manufacture sample connection bodies in which an evaluation-use IC was connected to an evaluation-use glass substrate, and inter-electrode positional deviation and short-circuit occurrence rates between electrodes intended for connection and adjacent electrodes were measured.

Anisotropic Conductive Film

In the binder resin layer of the anisotropic conductive film used to connect the evaluation-use IC, 60 pts. mass of a phenoxy resin (trade name: YP-50, manufactured by NIPPON STEEL & SUMIKIN CHEMICAL CO., LTD.), 40 pts mass of an epoxy resin (trade name: jER828, manufactured by Mitsubishi Chemical Corporation) and 2 pts. mass of a curing agent (trade name: SI-60L, manufactured by SANSHIN CHEMICAL INDUSTRY CO., LTD.) were added to a solvent to prepare a binder resin composition, this binder resin composition was applied to a release-treated film and baked. In Examples 1 to 3 and Comparative Examples 1 and 2, conductive particles (trade name: AUL 704, manufactured by Sekisui Chemical Co., Ltd.) were regularly arranged in a grid array so as to occupy a selected occupation area before transferring the conductive particles to the binder resin layer supported by the release-treated film to obtain an anisotropic conductive film in which the conductive particles were arranged regularly. Additionally, in Comparative Example 3, conductive particles were dispersed in the binder resin composition and this was applied to a release-treated film and baked to obtain an anisotropic conductive film in which the conductive particles were arranged randomly.

Evaluation-Use IC

As an evaluation device, an evaluation-use IC having outer dimensions of 1.5×13 mm, thickness of 0.5 mm, bump dimensions of 25×140 µm, inter-bump space of 7.5 µm, and bump height of 15 µm (Au-plated) was used.

Evaluation-Use Glass Substrate

As an evaluation-use glass substrate to which the evaluation-use ICs were connected, a glass was used which had outer dimensions of 30×50 mm, a thickness of 0.5 mm and an ITO pattern formed in a comb-like shape thereon at a size and pitch equivalent to the bumps on the evaluation-use IC.

The anisotropic conductive film was temporarily pasted to the evaluation-use glass substrate before mounting the evaluation-use IC while keeping alignment between the bumps of the evaluation-use IC and the wiring electrodes of the evaluation-use glass substrate; by thermocompression-bonding with a thermocompression head under conditions of 180° C., 80 MPa and 5 seconds, connection body samples were manufactured. For each connection body sample, inter-electrode positional deviation and short-circuit occurrence-rates between electrodes intended for connection and adjacent electrodes were measured. In inter-electrode positional deviation, the amounts of deviation between bumps of the evaluation-use IC and electrodes of the evaluation-use glass substrate, which were formed to be same size, were measured. Additionally, in short-circuit occurrence rates between adjacent terminals, between all of the bumps of the evaluation-use IC and between all of the electrode terminals of the glass substrate, short-circuit occurrence rates between adjacent terminals were measured.

Example 1

In Example 1, an anisotropic conductive film was used in which conductive particles were arranged regularly so as to occupy an area of 1%. Furthermore, in Example 1, the IC-side alignment mark provided on the mounting surface of the evaluation-use IC and the substrate-side alignment mark provided on the evaluation-use glass substrate were formed in approximately the same position as viewed from a planar perspective.

Example 2

In Example 2, an anisotropic conductive film was used in which conductive particles were arranged regularly so as to occupy an area of 15% with other conditions being the same as in Example 1.

Example 3

In Example 3, an anisotropic conductive film was used in which conductive particles were arranged regularly so as to occupy an area of 35% with other conditions being the same as in Example 1.

Comparative Example 1

In Comparative Example 1, the substrate-side alignment mark was arranged at a location that was outside of the transfer area of the anisotropic conductive film and separated from the position of the IC-side alignment mark with other conditions being the same as in Example 2.

Comparative Example 2

In Comparative Example 2, an anisotropic conductive film was used in which conductive particles were arranged regularly so as to occupy an area of 50% with other conditions being the same as in Example 1.

Comparative Example 3

In Comparative Example 3, an anisotropic conductive film was used in which conductive particles were randomly dispersed so as to occupy an area of 35% with other conditions being the same as in Example 1.

TABLE 1

|  | Ex. 1 | Ex. 2 | Ex. 3 | Comp. 1 | Comp. 2 | Comp. 3 |
| --- | --- | --- | --- | --- | --- | --- |
| Particle Occupation Area (%) | 1 | 15 | 35 | 15 | 50 | 35 |
| Particle Arrangement | Regular | Regular | Regular | Regular | Regular | Random |
| Alignment Mark Position | Same | Same | Same | Separated | Same | Same |
| Positional Deviation (μm) | 1 | 1 | 1.3 | 4 | 4 | 3 |
| Inter-Electrode Short Circuit Occurrence Rate (ppm) | 30 | 30 | 70 | 500 | 500 | 400 |

As represented in Table 1, in Examples 1 to 3, all positional deviation values were within 1 to 1.3 μm and high-accuracy alignment was achieved. In Examples 1 to 3, by using an anisotropic conductive film in which the conductive particles were arranged regularly so as to occupy an area of 35% or less as viewed from a planar perspective, the alignment marks were able to be imaged through the anisotropic conductive film and, even in the case of the conductive particles overlapping the outside edges of the alignment marks, line segments of the outside edges of the alignment marks were exposed between the conductive particles and, because contrast differences at boundaries of these line segments were discernible, positions of the alignment marks were detectable with a high accuracy.

Moreover, in Examples 1 to 3, short-circuit occurrence rates between electrodes were low at 30 to 70 ppm. In improving alignment accuracy, positional deviation between bumps of the evaluation-use IC and wiring electrodes of the evaluation-use glass substrate is minimized in edge-side areas so that unwanted contact between conductive particles in these areas and conductive particles in inter-bump areas is less likely to occur, thereby short circuits were prevented from occurring between adjacent terminals. Thus, if oppositional displacement occurs between opposing wiring electrodes and bumps, distance is reduced between bumps and terminals intended for connection and adjacent bumps and terminals. In this case, conduction due to conductive particles between (diagonally) adjacent bumps and wiring electrodes, which generates a short circuit, is a concern; however, in accordance with improvements in alignment accuracy which minimizes displacement between bumps and wiring electrodes intended for connection, it is reasoned that such a phenomenon became less likely to occur.

In contrast, in the Comparative Example 1, because the substrate-side alignment mark was arranged at a location outside of the transfer area of the anisotropic conductive film, the substrate-side alignment mark and the IC-side alignment mark were separated, thereby adversely affecting alignment precision. Consequently, positional deviation between the bumps of the evaluation-use IC and the electrodes of the evaluation-use glass substrate was large at 4 μm. Moreover, due to the misalignment, the short-circuit occurrence rate between adjacent electrodes was increased to 500 ppm.

Furthermore, in Comparative Example 2, because the conductive particles occupied an area of 50%, the outside edges of the alignment marks were not discernible by the camera, thereby adversely affecting alignment precision. Consequently, positional displacement between the bumps of the evaluation-use IC and the electrodes of the evaluation-use glass substrate was large at 4 μm. Moreover, due to the misalignment, the short-circuit occurrence rate between adjacent electrodes was increased to 500 ppm.

Still further, in Example 3, because the conductive particles were randomly dispersed, agglomerations of the conductive particles occurred and visibility of the outside edges was thus impaired, thereby adversely affecting alignment precision. Consequently, displacement between the bumps of the evaluation-use IC and the electrodes of the evaluation-use glass substrate was large at 3 μm. Moreover, due to the misalignment, the short-circuit occurrence rate between adjacent electrodes was increased to 400 ppm.

REFERENCE SIGNS LIST

1 anisotropic conductive film, 2 release-treated film, 3 binder resin layer, 4 conductive particles, 10 liquid crystal display panel, 11, 12 transparent substrates, 12a edge area, 13 seal, 14 liquid crystal, 15 panel display unit, 16, 17 transparent electrodes, 17a terminal portions, 18 liquid crystal driver IC, 18a mounting surface, 19 electrode terminals, 20 COG mounting portion, 21 substrate-side alignment mark, 22 IC-side alignment mark, 30 imaging camera, 33 thermocompression head

The invention claimed is:

1. An alignment method comprising:
arranging an adhesive containing conductive particles on a surface of a transparent substrate having a substrate-side alignment mark and mounting an electronic component having a component-side alignment mark so that the transparent substrate and the electronic component face each other via the adhesive interposed therebetween;
imaging the substrate-side alignment mark and the electronic component-side alignment mark from the back surface side of the transparent substrate; and
adjusting a position of the substrate-side alignment mark and the component-side alignment mark by using a captured image obtained by imaging to adjust a mounting position of the electronic component with respect to the transparent substrate;
wherein the adhesive agent has the conductive particles arranged regularly as viewed from a planar perspective; and wherein in the captured image, outside edges of the substrate-side alignment mark or the component-side alignment mark exposed between the conductive particles are intermittently visible as line segments along imaginary line segments of the outside edges of the substrate-side alignment mark or the component-side alignment mark.

2. The alignment method according to claim 1, wherein the line segments exposed between the conductive particles along the imaginary line segments appear in a length of 25% or more of the imaginary line segments.

3. The alignment method according to claim 1, wherein in the captured image, an area between the conductive particles of the adhesive agent is 65% or more.

4. The alignment method according to claim 1, wherein the imaging camera used to image the captured image of the substrate-side alignment mark and the component-side alignment mark has a resolution that is finer than an average particle diameter of the conductive particles.

5. The alignment method according to claim 2, wherein the imaging camera used to capture the captured image of the substrate-side alignment mark and the component-side alignment mark has a resolution that is finer than an average particle diameter of the conductive particles.

6. The alignment method according to claim 1, wherein the substrate-side alignment mark is formed at a position at which the adhesive agent is provided.

7. A method for manufacturing a connection body comprising:
arranging an adhesive containing conductive particles on a surface of a transparent substrate having a substrate-side alignment mark and mounting an electronic component having a component-side alignment mark so that the transparent substrate and the electronic component face each other via the adhesive interposed therebetween;
imaging the substrate-side alignment mark and the electronic component-side alignment mark from the back surface side of the transparent substrate; and
adjusting a position of the substrate-side alignment mark and the component-side alignment mark by using a captured image obtained by imaging to adjust a mounting position of the electronic component with respect to the transparent substrate;
wherein the adhesive agent has the conductive particles arranged regularly as viewed from a planar perspective; and
wherein in the captured image, outside edges of the substrate-side alignment mark or the component-side alignment mark exposed between the conductive particles are intermittently visible as line segments along imaginary line segments of the outside edges of the substrate-side alignment mark or the component-side alignment mark.

8. The alignment method according to claim 2, wherein in the captured image, an area between the conductive particles of the adhesive agent is 65% or more.

9. The alignment method according to claim 3, wherein the imaging camera used to image the captured image of the substrate-side alignment mark and the component-side alignment mark has a resolution that is finer than an average particle diameter of the conductive particles.

10. The alignment method according to claim 2, wherein the substrate-side alignment mark is formed at a position at which the adhesive agent is provided.

11. A method for connecting an electronic component comprising:
arranging an adhesive containing conductive particles on a surface of a transparent substrate having a substrate-side alignment mark and mounting an electronic component having a component-side alignment mark so that the transparent substrate and the electronic component face each other via the adhesive interposed therebetween;
imaging the substrate-side alignment mark and the electronic component-side alignment mark from the back surface side of the transparent substrate; and
adjusting a position of the substrate-side alignment mark and the component-side alignment mark by using a captured image obtained by imaging to adjust a mounting position of the electronic component with respect to the transparent substrate;
wherein the adhesive agent has the conductive particles arranged regularly as viewed from a planar perspective; and
wherein in the captured image, outside edges of the substrate-side alignment mark or the component-side alignment mark exposed between the conductive particles are intermittently visible as line segments along imaginary line segments of the outside edges of the substrate-side alignment mark or the component-side alignment mark.

12. A connection body manufactured by the method of claim 7.

13. The alignment method according to claim 1, wherein the adhesive agent is an anisotropic conductive film.

14. The method for connecting an electronic component according to claim 11, wherein the adhesive agent is an anisotropic conductive film.

15. The method for manufacturing a connection body according to claim 7, wherein the adhesive agent is an anisotropic conductive film.

16. The alignment method according to claim 1, wherein the transparent substrate is provided with an electrode terminal.

17. The alignment method according to claim 1, wherein the transparent substrate is provided with a transparent electrode.

18. The method for connecting an electronic component according to claim 11, wherein the transparent substrate is provided with an electrode terminal.

19. The method for connecting an electronic component according to claim 11, wherein the transparent substrate is provided with a transparent electrode.

20. The method for manufacturing a connection body according to claim 7, wherein the transparent substrate is provided with an electrode terminal.

21. The method for manufacturing a connection body according to claim 7, wherein the transparent substrate is provided with a transparent electrode.

* * * * *